(12) United States Patent
Glorieux et al.

(10) Patent No.: US 8,837,206 B2
(45) Date of Patent: Sep. 16, 2014

(54) MEMORY DEVICE

(71) Applicant: STMicroelectronics (Crolles 2) SAS, Crolles (FR)

(72) Inventors: Maximilien Glorieux, Grenoble (FR); Sylvain Clerc, Grenoble (FR); Gilles Gasiot, Seyssinet-Pariset (FR); Phillippe Roche, Biviers (FR)

(73) Assignee: STMicroelectronics (Crolles 2), Crolles (FR)

( * ) Notice: Subject to any disclaimer, the term of this patent is extended or adjusted under 35 U.S.C. 154(b) by 129 days.

(21) Appl. No.: 13/669,226

(22) Filed: Nov. 5, 2012

(65) Prior Publication Data

US 2013/0121070 A1    May 16, 2013

(30) Foreign Application Priority Data

Nov. 16, 2011    (FR) ...................................... 11 60411

(51) Int. Cl.
*G11C 11/00*    (2006.01)
(52) U.S. Cl.
USPC ......................................................... 365/154
(58) Field of Classification Search
USPC ......................................................... 365/154
See application file for complete search history.

(56) References Cited

U.S. PATENT DOCUMENTS

| 5,956,008 | A | 9/1999 | Kawasaki et al. |
|---|---|---|---|
| 7,321,506 | B2 | 1/2008 | Roche et al. |
| 2006/0082535 | A1 | 4/2006 | Osame |
| 2007/0159873 | A1* | 7/2007 | Boemler ........................ 365/154 |
| 2008/0054973 | A1* | 3/2008 | Chan et al. .................... 327/208 |
| 2010/0220094 | A1 | 9/2010 | Watanabe |
| 2012/0155151 | A1* | 6/2012 | Rachamadugu et al. ..... 365/154 |
| 2013/0083618 | A1* | 4/2013 | Sathianathan ........... 365/230.06 |

FOREIGN PATENT DOCUMENTS

EP    1280162 A2    1/2003

OTHER PUBLICATIONS

French Search Report received in Application No. 1160411 mailed May 25, 2012, 7 pages.

* cited by examiner

*Primary Examiner* — Hoai V Ho
(74) *Attorney, Agent, or Firm* — Slater & Matsil, L.L.P.

(57) ABSTRACT

A memory device includes first and second inverters cross-coupled between first and second nodes. The first inverter is configured to be supplied by a first supply voltage via a first transistor and the second inverter is configured to be supplied by the first supply voltage via a second transistor. A first control circuit is configured to control a gate node of the first transistor based on the voltage at the second node and at a gate node of the second transistor. A second control circuit is configured to control the gate node of the second transistor based on the voltage at the first node and at the gate node of the first transistor.

28 Claims, 2 Drawing Sheets

MEMORY DEVICE

CROSS-REFERENCE TO RELATED APPLICATIONS

This application claims the priority benefit of French patent application number 1160411, filed on Nov. 16, 2011, which is hereby incorporated by reference to the maximum extent allowable by law.

TECHNICAL FIELD

The present disclosure relates to a memory device and in particular to a radiation hardened memory device.

BACKGROUND

FIG. 1 illustrates a typical data latch 100 formed of a pair of inverters 102 and 104 cross coupled between nodes 106 and 108. Node 106 is coupled to a data input 110 via an inverter 112, while node 108 is coupled to a data output 114 via an inverter 116. The inverters 104 and 112 are each clocked by a clock signal CP and its inverse clock signal $\overline{CP}$.

An example of the transistors forming inverters 102 and 104 is illustrated in FIG. 1. Inverter 102 comprises a P-channel MOS (PMOS) transistor 118 and an N-channel MOS (NMOS) transistor 120 coupled in series between a supply voltage $V_{DD}$ and ground, and having their gate nodes coupled to node 106 and their drain nodes coupled to node 108. Similarly, inverter 104 comprises a PMOS transistor 122 and an NMOS transistor 124 having their gate nodes coupled to node 108 and their drain nodes coupled to node 106. The source of transistor 122 is coupled to the supply voltage $V_{DD}$ via a further PMOS transistor 126, which receives at its gate node the inverse clock signal $\overline{CP}$. The source of transistor 124 is coupled to ground via a further NMOS transistor 128, which receives at its gate node the clock signal CP.

In operation, when the clock signal CP is low, the latch 100 is in a write mode, in which the data signal is coupled to node 106, and inverter 104 is isolated by the deactivation of transistors 126 and 128, such that the high or low value of the data is stored at node 106, and the inverse of this data value is stored at node 108. When the clock signal CP is high, the latch 100 is in a data retention mode, in which inverter 112 is deactivated, and the transistors 126 and 128 of inverter 104 are activated in order to maintain the programmed state at node 106.

In the retention mode, the latch 100 should maintain its programmed state. However, certain types of radiation may induce a parasitic current in one of the inverters 102, 104 that can cause the binary state of the latch to flip. For example, α radiation hitting one of the transistors of inverter 102 or 104 may induce such a current.

α radiation generally originates from impurities contained in the housing of the integrated circuit, and one solution for protecting latches is to modify the housing to remove the impurities. However, such a solution is relatively costly. Alternative solutions have been proposed that involve duplicating the inverters in the latch, but such solutions greatly increase the number of transistors of the latch, and in particular the number of transistors in the data path. This leads to relatively high energy consumption and reduced speed.

SUMMARY OF THE INVENTION

According to one aspect, a memory device comprises first and second inverters cross-coupled between first and second nodes. The first inverter is configured to be supplied by a first supply voltage via a first transistor and the second inverter is configured to be supplied by the first supply voltage via a second transistor. A first control circuit is configured to control a gate node of the first transistor based on the voltage at the second node and at a gate node of the second transistor. A second control circuit is configured to control the gate node of the second transistor based on the voltage at the first node and at the gate node of the first transistor.

According to one embodiment, the first control circuit comprises a third transistor coupled between the gate node of the first transistor and the second supply voltage and having its gate node coupled to the gate node of the second transistor. A fourth transistor is coupled between the gate node of the first transistor and the first supply voltage and has its gate node coupled to the second node. The second control circuit comprises a fifth transistor coupled between the gate node of the second transistor and the second supply voltage and having its gate node coupled to the gate node of the first transistor. A sixth transistor is coupled between the gate node of the second transistor and the first supply voltage and has its gate node coupled to the first node.

According to a further embodiment, the third and fifth transistors are NMOS transistors and the fourth and sixth transistors are PMOS transistors.

According to a further embodiment, the second control circuit further comprises a seventh transistor coupled between the gate node of the second transistor and the second supply voltage and having its gate node coupled to the second node.

According to a further embodiment, the first and second transistors are PMOS transistors.

According to a further embodiment, the first inverter comprises a pair of complementary transistors coupled in series between the second supply voltage and a main current terminal of the first transistor, and having their gate nodes coupled to the first node. The second inverter comprises a pair of complementary transistors coupled in series between the second supply voltage and a main current terminal of the second transistor, having their gate nodes coupled to the second node.

According to a further embodiment, the second inverter further comprises a further transistor controlled by a clock signal to activate the second inverter.

According to a further embodiment, the first control circuit comprises least one transistor controlled by a clock signal.

According to a further aspect, a data latch comprises the above memory device and an input buffer coupled to the first node and activated by a clock signal.

According to yet a further aspect, a memory cell comprises the above memory device in which the first node is coupled to a first bit line via a first access transistor, and the second node is coupled to a second bit line via a second access transistor.

According to yet a further aspect, a memory comprises an array of the memory cells. Each memory cell comprises the above memory device.

BRIEF DESCRIPTION OF THE DRAWINGS

The foregoing and other purposes, features, aspects and advantages of the embodiments described herein will become apparent from the following detailed description, given by way of illustration and not limitation with reference to the accompanying drawings, in which.

DETAILED DESCRIPTION OF ILLUSTRATIVE EMBODIMENTS

Figure 2:
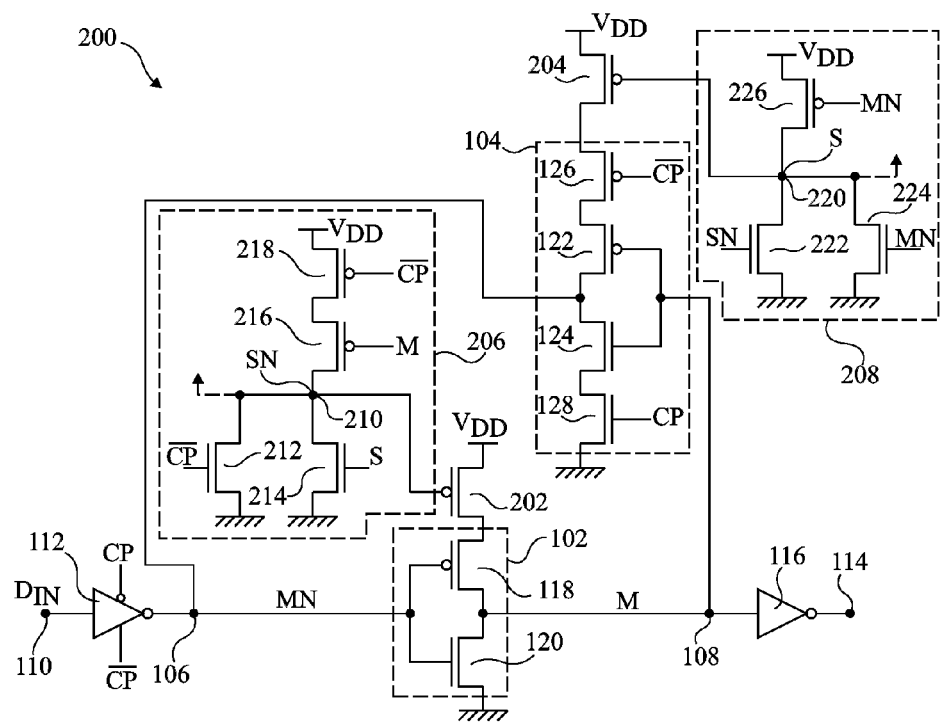
FIG. 2 schematically illustrates a data latch according to an example embodiment of the present disclosure.

FIG. 2 schematically illustrates a data latch 200 according to an example embodiment of the present disclosure.

Figure 1:
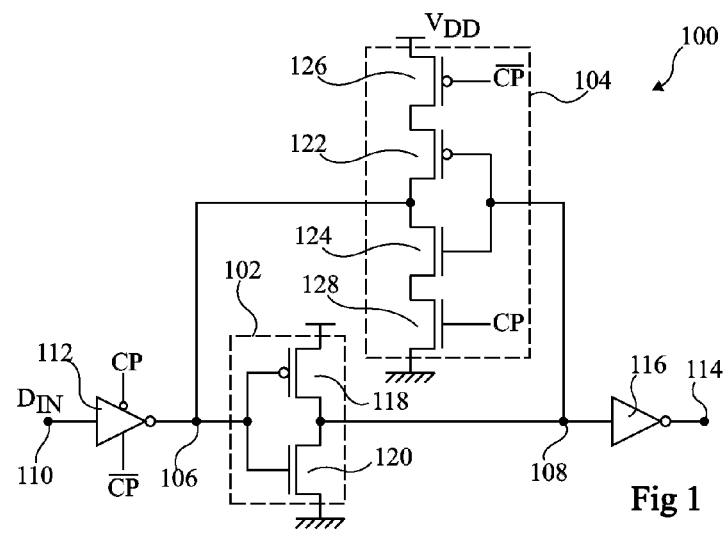
FIG. 1 schematically illustrates an example of a data latch.

Latch 200 comprises the same inverters 102, 104, 112 and 116 of FIG. 1 described above, which will not be described again in detail.

Latch 200 further comprises a PMOS transistor 202 coupled between the PMOS transistor 118 of inverter 102 and the supply voltage $V_{DD}$, and a PMOS transistor 204 coupled between the PMOS transistor 126 of inverter 104 and the supply voltage $V_{DD}$. The gate node of transistor 202 is controlled by a control circuit 206 and the gate node of transistor 204 is controlled by a control circuit 208.

Control circuit 206 comprises a node 210 coupled to the gate of transistor 202, and also coupled to ground via NMOS transistors 212 and 214, which are coupled in parallel. Node 210 is further coupled to the supply voltage $V_{DD}$ via PMOS transistors 216 and 218, which are coupled in series. Transistors 212 and 218 are controlled at their gate nodes by the inverse clock signal $\overline{CP}$. Transistor 214 is controlled at its gate node by a signal S, which originates from control circuit 208. Transistor 216 is controlled at its gate node by a signal M, which is the voltage at node 108 at the output of inverter 102.

Control circuit 208 comprises a node 220 coupled to the gate of transistor 204 and also coupled to ground via NMOS transistors 222 and 224 coupled in parallel. Node 220 is further coupled to the supply voltage $V_{DD}$ via a PMOS transistor 226. Transistors 224 and 226 are controlled at their gate nodes by a signal MN, which is the voltage at node 106 at the output of inverters 104 and 112. Transistor 222 is controlled at its gate node by a signal SN, which originates from control circuit 206, and in particular from node 210 of circuit 206. The node 220 of circuit 208 provides the signal S to transistor 214 of control circuit 206.

The transistors 202 and 204 protect the latch 200 from radiation hitting either of the NMOS transistors 120 or 124 of inverters 102, 104. Indeed, the present inventors have found that, in certain types of technology, radiation, such as α, neutron, proton and heavy ion radiation, poses a greater problem for NMOS devices than for PMOS transistors. Thus by protecting the NMOS devices, the risk of an error caused by such radiation can be more than halved.

An example of the operation of the latch 200 will now be described with reference to the timing diagram of FIG. 3, which illustrates the data signal $D_{IN}$, clock signal CP, signals MN and M at nodes 106 and 108, and signals SN and S at nodes 210 and 220 of the control circuits 206, 208.

Figure 3:
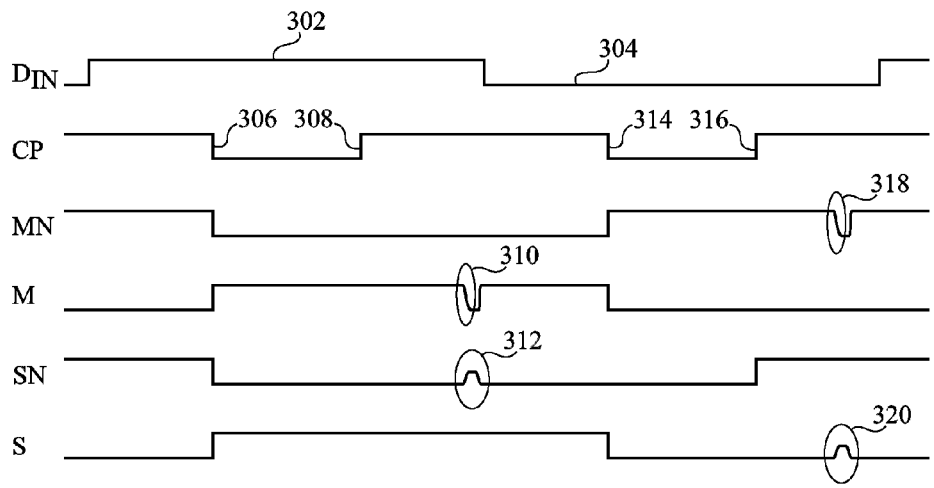
FIG. 3 is a timing diagram showing an example of signals present in the data latch of FIG. 2 according to an embodiment of the present disclosure.

In FIG. 3, it is assumed that the data signal present at the input node 110 of latch 200 is high during a period 302 and then low during a period 304.

The clock signal CP is for example initially high, meaning that the latch 200 is in the retention mode. In the illustrated example, the memory device stores a low value initially. Then, a falling edge 306 of clock signal CP during the period 302 triggers a write operation of latch 200. In particular, inverter 112 is activated and inverter 104 is deactivated, and thus the inverse of the data signal $D_{IN}$ is asserted by inverter 112 at node 106 as shown by the signal MN in FIG. 3. Transistor 212 forces signal SN low, which activates transistor 202. The inverter 102 in turn asserts the data signal $D_{IN}$ at node 108 as shown by the signal M in FIG. 3. The low signal MN deactivates transistor 224 and activates transistor 226 of control circuit 208, thereby bringing the signal S high.

The clock signal CP then goes high at a rising edge 308, triggering again the retention mode, in which inverter 112 is deactivated, and the transistors 126 and 128 of inverter 104 are activated. It is then assumed that radiation hits the NMOS transistor 120 of inverter 102, inducing a current and causing the signal M to fall, as shown by a falling edge 310 in FIG. 3. However, because transistor 204 is deactivated by the high signal S, the inverter 104 cannot propagate the low state of voltage M at node 108 to node 106. The falling edge of signal M for example causes a short rise of signal SN at node 210 of the control circuit 206, but because transistor 214 remains activated, the voltage SN quickly recovers to Zero. Furthermore, as transistor 202 is activated by the low signal SN, the voltage M at node 108 recovers to the high voltage. Thus the state of the latch 200 is maintained.

The clock signal CP then for example goes low at a falling edge 314 triggering again the write mode, but this time during the period 304 in which the data signal $D_{IN}$ is low. Signal MN thus goes high, and signal M goes low. This activates transistor 224 and deactivates transistor 226 of control circuit 208, thereby bringing signal S low, and activating transistor 204. The low state of signal M activates transistor 216 of control circuit 206. However, during the write mode, transistor 218 is deactivated by the high signal of the inverse clock signal $\overline{CP}$, and transistor 202 stays activated to enable both sides of the latch to be written to. Thus it is only at the subsequent rising edge 316 of the clock signal CP that the signal SN goes high.

It is then assumed that, during the retention mode, radiation hits the NMOS transistor 124 of inverter 104, inducing a current that causes the voltage MN at node 106 to drop, as shown by a falling edge 318 in FIG. 3. However, because transistor 202 is deactivated by the high signal SN, inverter 102 cannot propagate the low state of voltage MN at node 106 to node 108. The falling edge of signal MN for example causes a short rise in the signal S due to the activation of transistor 226 of control circuit 208, as shown labelled 320. However, transistor 222 remains activated, and thus signal S quickly falls again to zero. Furthermore, because transistor 204 is activated, the voltage MN at node 106 quickly recovers. Thus the state of the latch 200 is maintained.

Figure 4:
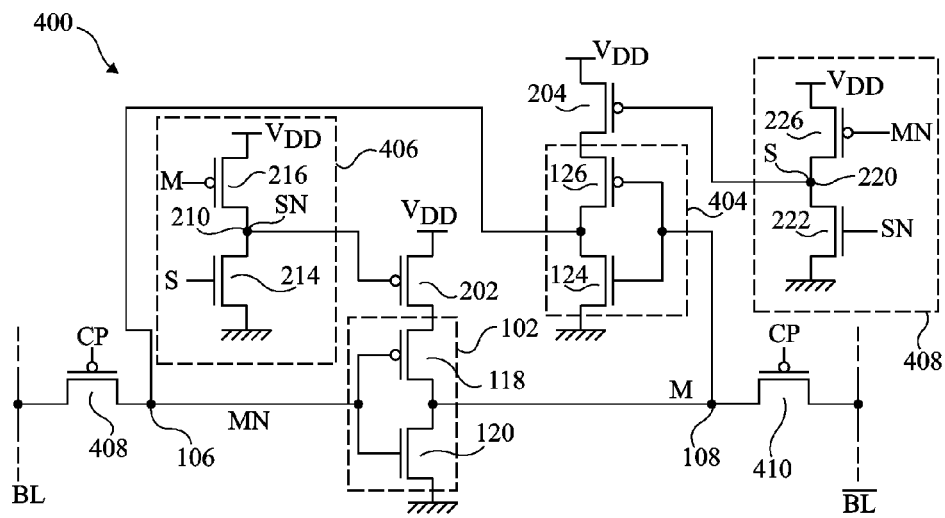
FIG. 4 schematically illustrates a memory cell according to a further example embodiment of the present disclosure.

FIG. 4 schematically illustrates a memory cell 400 according to a further example embodiment.

The memory cell 400 is similar to the latch 200 of FIG. 2 and like features have been labelled with like reference numerals and will not be described again in detail.

In the memory cell 400, the inverter 104 of FIG. 2 is replaced by an inverter 404 comprising only the NMOS transistor 124 and PMOS transistor 126. Furthermore, the control block 206 of FIG. 2 is replaced by a control block 406, comprising only the NMOS transistor 214 and PMOS transistor 216. Similarly, the control block 208 of FIG. 2 is replaced by a control block 408 comprising only the NMOS transistor 222 and the PMOS transistor 226. Instead of input and output inverters 112, 116, the memory cell 400 comprises access transistors 408 and 410. Transistor 408 is a PMOS transistor coupling node 106 to a bit line BL. Transistor 410 is a PMOS transistor coupling node 108 to a bit line $\overline{BL}$. Transistors 408 and 410 are controlled by the clock signal CP.

Operation of memory cell 400 is similar to that of the latch 200, except that to program the nodes 106 and 108, both of the access transistors 408, 410 are activated by the low clock signal CP, and the data signal $D_{IN}$ is applied to the bit line BL and its inverse to bit line $\overline{BL}$. The control circuits 406 and 408 operate in a similar fashion to the control circuits 206 and 208 of FIG. 2, with one or the other of PMOS transistors 202, 204 being deactivated depending on the state of signals MN and M at nodes 106 and 108. Thus the circuit is protected from radiation hitting the NMOS transistors 120 and 124 in a similar fashion to latch 200.

It will be apparent to those skilled in the art that the circuits of FIGS. 2 and 4 could be adapted to be protected against radiation hitting the PMOS transistors 118 and 126 rather than the NMOS transistors. For example, this could simply involve replacing PMOS transistors 202, 204 by NMOS transistors coupled between transistors 120 and 124 respectively and ground, these NMOS transistors being controlled by the inverse of the signals generated by the corresponding control circuits 206, 406 and 208, 408.

Figure 5:
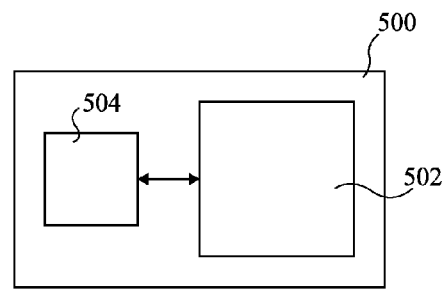
FIG. 5 very schematically illustrates an electronic device according to an example embodiment of the present disclosure.

FIG. 5 schematically illustrates an electronic device 500 comprising a memory block 502 comprising one or more of the memory devices of FIG. 2 or 4 described above. In particular, the memory block 502 for example comprises one or more latches 200, or an array of the memory cells 400 forming for example an SRAM (static random access memory). Control circuitry 504 is coupled to the memory block, and for example generates the clock signal CP and/or the data signal $D_{IN}$, and receives data read from the latches/memory cells.

An advantage of the embodiments described herein is that a memory device is radiation hardened by the addition of relatively few transistors, and in particular very few additional transistors in the data path. This leads to a minimal delay penalty with respect to a standard latch.

Having thus described at least one illustrative embodiment of the invention, various alterations, modifications and improvements will readily occur to those skilled in the art.

For example, while certain examples of inverter circuits have been described, it will be apparent to those skilled in the art that alternative circuits could be used, for example with further transistors in parallel or series in order to provide additional functions. Furthermore, it will be apparent to those skilled in the art that the control circuits 206, 208 and 406, 408 are provided by way of example only, and that other arrangements of the transistors and control signals M, MN, S, SN, CP and $\overline{CP}$ would be possible.

As a further example, while the write operation of latch 200 of FIG. 2 is activated by a low value of the clock signal CP, it could instead be activated by a high value of clock signal CP, by exchanging throughout the circuit of latch 200 the clock signal CP by the inverse clock signal $\overline{CP}$. For example, in inverter 104, PMOS transistor 126 would be controlled by clock signal CP, and NMOS transistor 128 would be controlled by the inverse clock signal $\overline{CP}$.

The embodiments described herein comprise PMOS and NMOS transistors, and it will be apparent to those skilled in the art how the circuits could be adapted to replace PMOS transistors by NMOS transistors, and vice-versa. Furthermore, other transistor technologies could be used, such as bipolar.

Accordingly, the foregoing description is by way of example only and is not intended to be limiting. The invention is limited only as defined in the following claims and the equivalent thereto.

What is claimed is:

1. A memory device comprising:
    first and second inverters cross-coupled between first and second nodes, the first inverter coupled to a first supply voltage node via a first transistor and the second inverter coupled to the first supply voltage node via a second transistor;
    a first control circuit configured to control a gate node of the first transistor based on the voltage at the second node and at a gate node of the second transistor; and
    a second control circuit configured to control the gate node of the second transistor based on the voltage at the first node and at the gate node of the first transistor.

2. The memory device of claim 1, wherein the first control circuit comprises:
    a third transistor coupled between the gate node of the first transistor and the second supply voltage node and having its gate node coupled to the gate node of the second transistor; and
    a fourth transistor coupled between the gate node of the first transistor and the first supply voltage node and having its gate node coupled to the second node.

3. The memory device of claim 2, wherein the second control circuit comprises:
    a fifth transistor coupled between the gate node of the second transistor and the second supply voltage node and having its gate node coupled to the gate node of the first transistor; and
    a sixth transistor coupled between the gate node of the second transistor and the first supply voltage node and having its gate node coupled to the first node.

4. The memory device of claim 3, wherein the third and fifth transistors are NMOS transistors and the fourth and sixth transistors are PMOS transistors.

5. The memory device of claim 3, wherein the second control circuit further comprises a seventh transistor coupled between the gate node of the second transistor and the second supply voltage node and having its gate node coupled to the second node.

6. The memory device of claim 1, wherein the first and second transistors are PMOS transistors.

7. The memory device of claim 1, wherein the first supply voltage node comprises a VDD node.

8. The memory device of claim 1, wherein:
    the first inverter comprises a pair of complementary transistors coupled in series between the second supply voltage node and a main current terminal of the first transistor, and having their gate nodes coupled to the first node; and
    the second inverter comprises a pair of complementary transistors coupled in series between the second supply voltage node and a main current terminal of the second transistor, having their gate nodes coupled to the second node.

9. The memory device of claim 8, wherein the second inverter further comprises a further transistor controlled by a clock signal to activate the second inverter.

10. The memory device of claim 1, wherein the first control circuit comprises at least one transistor controlled by a clock signal.

11. The memory device of claim 1, wherein the first node is coupled to a first bit line via a first access transistor, and the second node is coupled to a second bit line via a second access transistor.

12. The memory device of claim 1, wherein the memory device comprises one memory cell in an array of memory cells.

13. A data latch comprising:
    the memory device of claim 1; and
    an input buffer coupled to the first node and activated by a clock signal.

14. A memory comprising:
a first bit line;
a second bit line; and
a plurality of memory cells coupled between the first bit line and the second bit line, each memory cell comprising:
   first and second inverters cross-coupled between first and second nodes, the first node coupled to the first bit line and the second node coupled to the second bit line, the first inverter coupled to a first supply voltage node via a first transistor and the second inverter coupled to the first supply voltage node via a second transistor;
   a first control circuit configured to control a gate node of the first transistor based on the voltage at the second node and at a gate node of the second transistor; and
   a second control circuit configured to control the gate node of the second transistor based on the voltage at the first node and at the gate node of the first transistor.

15. The memory of claim 14, wherein each memory cell further comprises a first access transistor coupled between the first node and the first bit line and a second access transistor coupled between the second node and the second bit line.

16. The memory of claim 14, wherein the memory comprises a plurality of complementary bit line pairs, the first and second bit lines forming one of the bit line pairs, wherein a plurality of memory cells is coupled between each of the bit line pairs, each memory cell having a common circuit configuration.

17. A memory device comprising:
a first reference voltage node;
a second reference voltage node;
a first transistor of a first conductivity type, the first transistor having a source, a drain and a gate;
a second transistor of a second conductivity type opposite the first conductivity type, the second transistor having a source coupled to the second reference voltage node, a drain coupled to the drain of the first transistor and a gate coupled to the gate of the first transistor;
a third transistor of the first conductivity type, the third transistor having a source, a drain coupled to the gates of the first and second transistors, and a gate coupled to the drains of the first and second transistors;
a fourth transistor of the second conductivity type, the fourth transistor having a source coupled to the second reference voltage node, a drain coupled to the drain of the third transistor, and a gate coupled to the gate of the third transistor;
a fifth transistor of the first conductivity type, the fifth transistor having a gate and a current path coupled between the source of the first transistor and the first reference voltage node;
a sixth transistor of the first conductivity type, the sixth transistor having a gate and a current path coupled between the source of the third transistor and the first reference voltage node;
a seventh transistor of the first conductivity type, the seventh transistor having a source coupled to the first reference voltage node, a drain coupled to the gate of the fifth transistor, and a gate;
an eighth transistor of the second conductivity type, the eighth transistor having a source coupled to the second reference voltage node, a drain coupled to the gate of the fifth transistor, and a gate;
a ninth transistor of the first conductivity type comprising a source coupled to the first reference voltage node, a drain coupled to the gate of the sixth transistor, and a gate; and
a tenth transistor of the second conductivity type, the tenth transistor comprising a source coupled to the second reference voltage node, a drain coupled to the gate of the sixth transistor, and a gate.

18. The memory device of claim 17, wherein the first conductivity type comprises p-type and wherein the second conductivity type comprises n-type.

19. The memory device of claim 18, wherein the first reference voltage node comprises a VDD node and wherein the second reference voltage node comprises a ground node.

20. The memory device of claim 17, further comprising:
a eleventh transistor of the second conductivity type, the eleventh transistor comprising a current path coupled between the source of the fourth transistor and the second reference voltage node and a gate; and
a twelfth transistor of the first conductivity type, the twelfth transistor comprising a current path coupled between the source of the third transistor and the first reference voltage node.

21. The memory device of claim 20, wherein the twelfth transistor has a drain coupled to the source of the third transistor and a source coupled to the drain of the sixth transistor.

22. The memory device of claim 20, further comprising a thirteenth transistor of the first conductivity type, the thirteenth transistor comprising a current path coupled between the source of the seventh transistor and the first reference voltage node, and a gate.

23. The memory device of claim 22, further comprising a fourteenth transistor of the second conductivity type, the fourteenth transistor having a source coupled to the second reference voltage node, a drain coupled to the gate of the fifth transistor, and a gate.

24. The memory device of claim 23, further comprising a fifteenth transistor of the second conductivity, the fifteenth transistor having a source coupled to the second reference voltage node, a drain coupled to the gate of the sixth transistor, and a gate.

25. The memory device of claim 24, further comprising an input buffer with an output coupled to the gates of the first and second transistors and an output buffer with an input coupled to the gates of the third and fourth transistors.

26. The memory device of claim 17, further comprising:
an input buffer with an output coupled to the gates of the first and second transistors; and
an output buffer with an input coupled to the gates of the third and fourth transistors.

27. The memory device of claim 17, further comprising:
a first access transistor with current path coupled to the gates of the first and second transistors; and
a second access transistor with a current path coupled to the gates of the third and fourth transistors.

28. The memory device of claim 27, wherein the current path of the first access transistor is coupled between the gates of the first and second transistors and a bit line; and
wherein the current path of the second access transistor is coupled between the gates of the first and second transistors and a complementary bit line.

* * * * *